United States Patent
Lo et al.

(10) Patent No.: US 8,907,709 B1
(45) Date of Patent: Dec. 9, 2014

(54) DELAY DIFFERENCE DETECTION AND ADJUSTMENT DEVICE AND METHOD

(71) Applicant: Realtek Semiconductor Corporation, Hsinchu (TW)

(72) Inventors: Yu-Cheng Lo, Taichung (TW);
Ying-Yen Chen, Chiayi County (TW);
Chao-Wen Tzeng, Taichung (TW);
Jih-Nung Lee, Hsinchu County (TW)

(73) Assignee: Realtek Semiconductor Corporation, Hsinchu (TW)

( * ) Notice: Subject to any disclaimer, the term of this patent is extended or adjusted under 35 U.S.C. 154(b) by 0 days.

(21) Appl. No.: 14/316,081

(22) Filed: Jun. 26, 2014

(30) Foreign Application Priority Data

Aug. 8, 2013 (TW) .............................. 102128550 A

(51) Int. Cl.
*H03L 7/00* (2006.01)
*H03K 5/06* (2006.01)

(52) U.S. Cl.
CPC ........................................ *H03K 5/06* (2013.01)
USPC .......................................... 327/161; 327/261

(58) Field of Classification Search
USPC ................................................. 327/161, 261
See application file for complete search history.

(56) References Cited

U.S. PATENT DOCUMENTS

| | | | |
|---|---|---|---|
| 6,437,713 B1 * | 8/2002 | Lesea .............................. | 341/78 |
| 6,671,652 B2 * | 12/2003 | Watson et al. ................ | 702/177 |
| 6,822,925 B2 * | 11/2004 | Van De Graaff ......... | 365/233.11 |
| 7,024,653 B1 * | 4/2006 | Moore et al. .................. | 716/121 |
| 7,026,850 B2 * | 4/2006 | Atyunin et al. ............... | 327/158 |
| 7,030,655 B2 * | 4/2006 | Choi .............................. | 326/86 |
| 7,400,555 B2 * | 7/2008 | Franch et al. ................ | 368/120 |
| 2003/0120456 A1 * | 6/2003 | Watson et al. ................ | 702/177 |
| 2010/0052747 A1 * | 3/2010 | Sugano et al. ................ | 327/157 |
| 2011/0074477 A1 * | 3/2011 | Nagarajan et al. ............ | 327/158 |
| 2011/0194575 A1 * | 8/2011 | Chen et al. ...................... | 372/25 |

* cited by examiner

*Primary Examiner* — Adam Houston
(74) *Attorney, Agent, or Firm* — WPAT, P.C.; Anthony King

(57) ABSTRACT

The present invention discloses a delay difference detection and adjustment device comprising: a first delay circuit including first delay units to receive and transmit a first clock; a second delay circuit including second delay units to receive and transmit a second clock; a storage circuit including storage units, each of which includes a data input end to receive the first clock and an operation clock reception end to receive the second clock, so that the storage circuit is operable to save a plurality of levels of the first clock according to the second clock; a delay control circuit to adjust the delay amount of the second delay circuit; and an analyzing circuit to generate an analysis result according to the cycle and levels of the first clock in which the analysis result indicates or is used to derive a unit delay difference between the first and second delay units.

10 Claims, 2 Drawing Sheets

DELAY DIFFERENCE DETECTION AND ADJUSTMENT DEVICE AND METHOD

BACKGROUND OF THE INVENTION

1. Field of the Invention

The present invention relates to a detection and adjustment device and method, especially to a delay difference detection and adjustment device and method.

2. Description of Related Art

In a synchronous circuit, a common reference clock is necessary for different components to operate synchronously. The common reference clock is usually generated by a frequency synthesizer in accordance with a source clock. However, because the paths from the frequency synthesizer to the different components are not the same, deviations (a.k.a. time difference or phase difference) may exist among the reference clocks received by the components. This problem is called clock skew, and a serious one will probably cause a malfunction of the synchronous circuit.

As semiconductor process development moves on and the process variation thereof becomes significant, the problem of clock skew is getting worse. Some solution is realized by enhancing the tolerance of the synchronous circuit to clock skew (e.g. adding guard bands to a time sequence and/or setting a clock de-rating factor) or adding a calibration function to the synchronous circuit for clock skew correction. However, if the design requirement of said solution is too loose, the problem of clock skew can't be resolved effectively; on the contrary, if the design requirement is too strict, it will be a waste of the design resource. Therefore, the key to efficiently using the resources is measuring the amount of clock skew accurately. Unfortunately, under the limitation of element precision (e.g. the minimal delay amount of a delay element), the current clock skew detection techniques are merely able to measure the deviation of a clock roughly. Hence, this technical field needs an invention capable of improving the accuracy of clock detection, so as to detect the deviation of a clock correctly for calibration or some utilization.

More prior arts can be found in the following documents: U.S. Pat. No. 6,671,652; and U.S. Pat. No. 7,400,555.

SUMMARY OF THE INVENTION

In consideration of the problems of the prior arts, an object of the present invention is to provide a delay difference detection and adjustment device and method capable of detecting and adjusting a delay difference between two delay circuits, so as to improve the prior arts.

Another object of the present invention is to provide the aforementioned delay difference detection and adjustment device and method, so as to raise the accuracy/precision of clock detection.

The present invention discloses a delay difference detection and adjustment device capable of detecting and adjusting a delay difference between two delay circuits. According to an embodiment of the present invention, the delay difference detection and adjustment device comprises: a first delay circuit including a plurality of serially connected first delay units operable to receive and then transmit a first clock; a second delay circuit including a plurality of serially connected second delay units operable to receive and then transmit a second clock in which the delay amount of the second delay circuit is adjustable; a storage circuit including a plurality of storage units coupled to the first and second delay circuits in which each of the storage units includes a data input end operable to receive the first clock from the first delay circuit and an operation clock reception end operable to receive the second clock from the second delay circuit, so that the storage circuit is operable to save a plurality of levels of the first clock in light of the second clock; a delay control circuit coupled to the second delay circuit and operable to adjust the delay amount of the second delay circuit; and an analyzing circuit coupled to at least one output end of the storage circuit and operable to generate an analysis result according to the cycle of the first clock and the plurality of levels of the first clock in which the analysis result indicates or is used to derive a unit delay difference between the first delay unit and the second delay unit.

The present invention also discloses a delay difference detection and adjustment method carried out by the delay difference detection and adjustment device of this invention or its equivalent and capable of detecting and adjusting a delay difference between two delay circuits. According to an embodiment of the present invention, the delay difference detection and adjustment method comprises the following steps: receiving and then transmitting a first clock through a plurality of first delay units connected in series; receiving and then transmitting a second clock through a plurality of second delay units connected in series; storing a plurality of levels of the first clock in light of the second clock through a plurality of storage units; generating an analysis result according to the cycle of the first clock and the plurality of levels of the first clock in which the analysis result indicates or is used to derive a unit delay difference between the first delay unit and the second delay unit; adjusting a delay amount caused by the plurality of second delay units; and after adjusting the delay amount, generating the analysis result again.

These and other objectives of the present invention will no doubt become obvious to those of ordinary skill in the art after reading the following detailed description of the preferred embodiments that are illustrated in the various figures and drawings.

DETAILED DESCRIPTION OF THE PREFERRED EMBODIMENTS

The following description is written by referring to terms of this invention field. If any term is defined in the specification, such term should be explained accordingly. Besides, the connection between objects or events in the disclosed embodiments can be direct or indirect provided that these embodiments are still applicable under such connection. Said "indirect" means that an intermediate object or a physical space is existed between the objects, or an intermediate event or a time interval is existed between the events. In addition, the following description relates to delay detection and adjustment technology, and the common knowledge known in this field will be omitted if such knowledge has little to do with the features of the present invention. Furthermore, the shape, size, and ratio of any element and the step sequence of any flow chart in the disclosed figures are just exemplary for understanding, not for limiting the scope of this invention.

The present invention discloses a delay difference detection and adjustment device and method capable of detecting and adjusting a delay difference between two delay circuits for a further utilization. Said device and method are applicable to an integrated circuit or a system device, and people of ordinary skill in the art can choose components or steps equivalent to those described in this specification to carry out the present invention, which means that the scope of this invention is not limited to the embodiments in the specification. On account of that some element by itself of said delay difference detection and adjustment device could be known, the detail of such element will be omitted provided that this omission nowhere dissatisfies the specification and enablement requirements. Besides, said delay difference detection and adjustment method can be in the form of firmware and/or software which could be carried out by the device of this invention or the equivalent thereof; therefore, the following description will abridge the hardware details for executing the method but put the emphasis on the steps.

Figure 1:
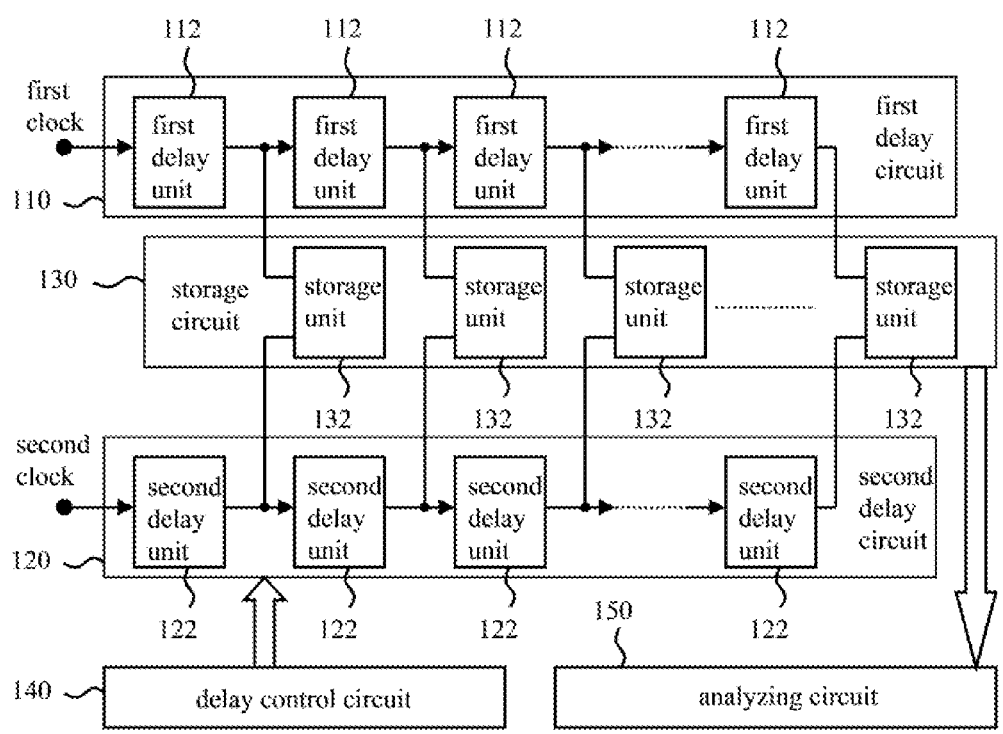
FIG. 1 illustrates a diagram of an embodiment of the delay difference detection and adjustment device of the present invention.

Please refer to FIG. 1 which illustrates a diagram of an embodiment of the delay difference detection and adjustment device of the present invention. This embodiment is capable of detecting a delay difference between two delay circuits and adjusting the delay difference to enhance the precision of measurement (e.g. phase difference measurement). As shown in FIG. 1, the delay difference detection and adjustment device 100 comprises: a first delay circuit 110; a second delay circuit 120; a storage circuit 130; a delay control circuit 140; and an analyzing circuit 150. Said first delay circuit 110 includes a plurality of serially connected first delay units 112, and is operable to receive and then transmit a first clock. Said second delay circuit 120 includes a plurality of serially connected second delay units 122, and is operable to receive and then transmit a second clock in which the delay amount of the second delay circuit 120 is adjustable. Said storage circuit 130 is coupled to the first and second delay circuits 110, 120, and includes a plurality of storage units 132, each of which includes a data input end operable to receive the first clock from the first delay circuit 110 and an operation clock reception end operable to receive the second clock from the second delay circuit 120, so that the storage circuit 130 is able to save a plurality of levels of the first clock in light of the second clock. Said delay control circuit 140 is coupled to the second delay circuit 120 and operable to adjust the delay amount of the second delay circuit 120. Said analyzing circuit 150 is coupled to at least one output end (not shown) of the storage circuit 130 and operable to generate an analysis result according to the cycle of the first clock and the plurality of levels of the first clock in which the analysis result indicates or is used to derive a unit delay difference between the first delay unit 112 and the second delay unit 122.

Please refer to FIG. 1 again. In this embodiment, each of the first delay units 112 has a constant delay amount (e.g. 20 ns); however, in an alternative embodiment, some or all of the first delay units 112 could be adjustable delay units. Besides, in the present embodiment, each of the second delay units 112 is an adjustable delay unit, so that the delay amount of the second delay circuit 120 is adjustable. Please note that those of ordinary skill in the art may take other manners to implement the second delay circuit 120; for instance, the second delay circuit 120 could be composed of a plurality of sets of delay sub-circuits, each of which contributes a distinct delay amount and is capable of receiving and transmitting the second clock through a switching circuit and providing the second clock for the storage circuit 130 through the switching circuit; in other words, through controlling the switching circuit, the present invention is able to choose an appropriate delay sub-circuit to transmit the second clock, which means that a different delay amount of the second delay circuit 120 can be realized by choosing a different delay sub-circuit. Please also note that since each of the aforementioned constant delay unit, adjustable delay unit and switching circuit by itself can be realized through known techniques, the hardware detail thereof will be omitted provided that the remaining disclosure is still enough for understanding and enablement.

Please refer to FIG. 1 once again. In this embodiment, the storage circuit 130 is a flip-flop circuit; more specifically, the storage units 132 of the storage circuit 130 are flip-flops. For instance, the storage circuit 130 is a flip-flop scan chain including a plurality of scanning flip-flops (i.e. the storage units 132) capable of storing the plurality of levels of the first clock according to the second clock and a selection signal and outputting the plurality of levels to the analyzing circuit 150 sequentially in accordance with the selection signal. For another instance, the storage circuit 130 includes a plurality of serially connected D-type flip-flops (corresponding to the storage units 132), each of which has a data output end coupled to the analyzing circuit 150, and these flip-flops are operable to store the plurality of levels of the first clock according to the second clock and output the levels to the analyzing circuit 140 in parallel for analysis. Since said flip-flop scan chain and D-type flip-flops by themselves are well known in this field, the detail thereof having little to do with the features of the present invention is therefore omitted.

Besides, in the present embodiment, the delay control circuit 140 progressively/gradually adjusts the delay amount of the second delay circuit 120, so as to make the plurality of levels of the first clock capable of reflecting at least two positive edges or negative edges of the first clock (that is to say at least one cycle of the first clock). Accordingly, the analyzing circuit 150 will be able to calculate the aforementioned unit delay difference between the first delay unit 112 and the second delay unit 122 in accordance with the cycle of the first clock and the plurality of its levels. For instance, the delay control circuit 140 changes the delay amount of the second delay circuit 120 from an initial delay amount (e.g. 10 ns for each second delay unit 122) to a current delay amount (e.g. 15 ns for each second delay unit 122) in which the current delay amount is greater than the initial delay amount but less than the delay amount of the first delay units 112 (e.g. 20 ns for each first delay unit 112). Therefore, the level record taken down by the storage circuit 130 will change from a first level sequence (e.g. 0011001100110011) under the initial delay amount to a second level sequence (e.g. 0000111110000011110000) under the current delay amount provided that each of the first and second level sequences should include at least two positive edges (i.e. the edges turning from level 0 to level 1) or negative edges (i.e. the edges turning from level 1 to level 0), so that the analyzing circuit 150 is able to derive said unit delay difference from the already known cycle of the first clock and a number of the first delay units associated with the interval between the positive or negative edges. Please note that if the duty cycle (e.g. 50%) of the first clock is also known in advance or has been derived, as long as the plurality of levels of the first clock reflects two adjacent edges (i.e. a rising/falling edge and the following falling/rising edge) of the first clock, the analyzing circuit 150 will be able to find out the unit delay difference according to the cycle and duty cycle of the first clock and the number of the first delay units 112 in connection with the interval between the two neighboring edges. In this way the delay control circuit 140 has more room to adjust the delay amount of the second delay circuit 120. Please also note that if the duty cycle of the first clock is unknown while a current level sequence (e.g. 0000111111111110000) only includes two edges, the analyzing circuit 150 may derive the duty cycle (e.g. 6/(6+4)=60%) of the first clock from a preceding level sequence (e.g. 0011111100001111100) and then calculate the unit delay difference of the current level sequence (e.g. $\Delta T=(T\times 60\%)/(12)$ in which $\Delta T$ is the unit delay difference, T is the cycle of the first clock, and 12 is the number of logic high levels in the current level sequence, that is to say the number of the first delay units 112 corresponding to the interval between the two edges). Please further note that the analyzing circuit 150 may include a calculating circuit to calculate the unit delay difference, the duty cycle of the first clock and etc.; since those of ordinary skill in the art can appreciate how to implement the calculating circuit with the known techniques, unnecessary and redundant description is therefore omitted.

In light of the above, the delay difference detection and adjustment device 100 of the present invention is operable to adjust the delay amount of the second delay circuit 120 and thereby diminish the unit delay difference, so as to increase the measurement accuracy/precision. In other words, it is fair to say that the unit delay difference can be taken as the equivalent delay amount of each of the first delay units 112 (while the delay amount of the second delay circuit 120 is viewed as 0); in this way, the equivalent delay amount will not be confined to the minimal delay amount (e.g. 10 ns) of a normal delay unit because of the joint contribution of the first and second delay units 112, 122. After reducing the unit delay difference (which would be used as a measuring unit), people of ordinary skill in the art can make use of the present invention and any known/self-designed clock edge detection technique to measure how many unit delay differences will amount to the phase difference between the first and second clocks, and thereby find out the phase difference accurately.

Figure 2:
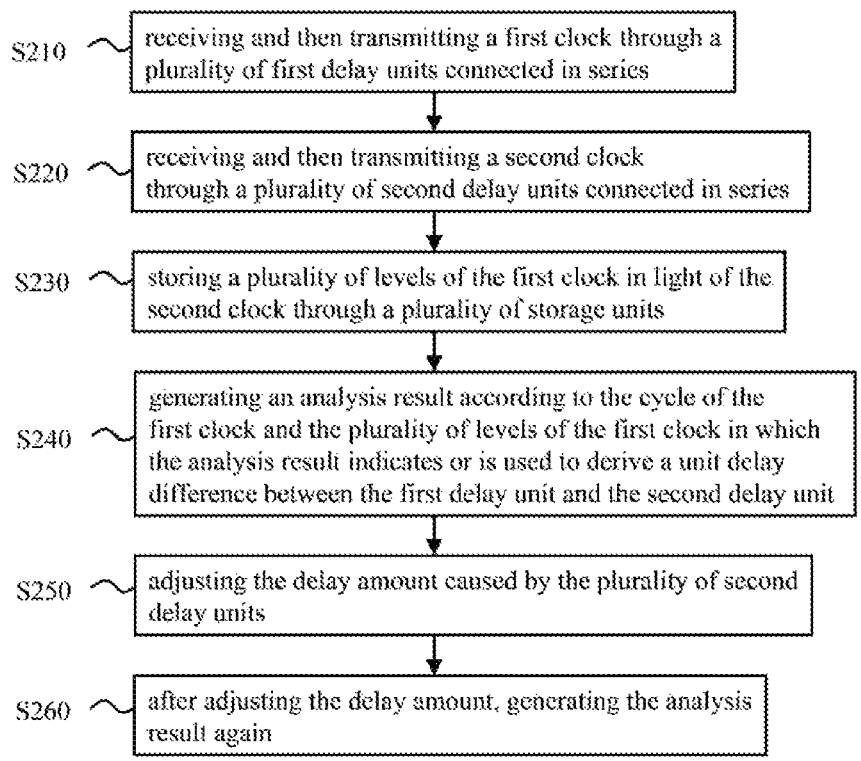
FIG. 2 illustrates a flow chart of an embodiment of the delay difference detection and adjustment method of the present invention.

Please refer to FIG. 2. In addition to the above-disclosed delay difference detection and adjustment device, the present invention further discloses a delay difference detection and adjustment method capable of detecting and adjusting a delay difference between two delay circuits. This method can be carried out by the device of the present invention or its equivalent, and comprises the following steps:

Step S210: receiving and then transmitting a first clock through a plurality of first delay units connected in series. This step can be carried out by the first delay circuit 110 of FIG. 1 or the equivalent thereof.

Step S220: receiving and then transmitting a second clock through a plurality of second delay units connected in series. This step can be carried out by the second delay circuit 120 of FIG. 1 or the equivalent thereof.

Step S230: storing a plurality of levels of the first clock in light of the second clock through a plurality of storage units. This step can be carried out by the storage circuit 130 of FIG. 1 or the equivalent thereof.

Step S240: generating an analysis result according to the cycle of the first clock and the plurality of levels of the first clock in which the analysis result indicates or is used to derive a unit delay difference between the first delay unit and the second delay unit. This step can be carried out by the analyzing circuit 150 of FIG. 1 or the equivalent thereof.

Step S250: adjusting the delay amount caused by the plurality of second delay units. This step can be carried out by the delay control circuit 140 of FIG. 1 or the equivalent thereof.

Step S260: after adjusting the delay amount, generating the analysis result again. This step can be carried out by the analyzing circuit 150 of FIG. 1 or the equivalent thereof.

In this embodiment, step S250 adjusts the delay amount of each second delay unit from an initial delay amount (e.g. 10 ns) to a current delay amount (e.g. 18 ns) in which the current delay amount is more than the initial delay amount but less than the delay amount (e.g. 20 ns) of each first delay unit or its average. Furthermore, the plurality of levels of the first clock reflects at least two positive edges or negative edges of the first clock, so that step S240 is able to measure the unit delay difference according to the cycle of the first clock and a number of the first delay units in connection with the interval between said at least two positive or negative edges. In an alternative embodiment of the present method, as long as the duty cycle of the first clock is known or has been derived, the plurality of levels of the first clock will only be required to include at least two neighboring edges (e.g. a rising/falling edge and the following falling/rising edge) which are enough for step S240 to generate the analysis result according to the cycle, the duty cycle and the plurality of levels of the first clock; in this case, step S250 will have more room for delay amount adjustment. In a further alternative embodiment, even though the duty cycle of the first clock is unknown, step S240 is operable to calculate the duty cycle in accordance with the plurality of levels of the first clock under the setting of the initial delay amount, and then generate the analysis result according to the plurality of levels under the setting of the current delay amount and the cycle and duty cycle of the first clock. The calculation detail has been explained in the preceding paragraphs when discussing the device invention.

Since people of ordinary skill in the art can fully understand the current embodiment and the modifications thereto by referring to FIG. 1 and the descriptions thereof, repeated and redundant explanation is therefore omitted provided that the remaining description is still sufficient for understanding and enablement. In fact, all the modifications applicable to the device embodiment are also applicable here. Please note that the shape, size, and ratio of any element and the step sequence of any flow chart in the disclosed figures are just exemplary for understanding, not for limiting the scope of this invention. Please also note that each of the fore-disclosed embodiments includes one or more features; however, this doesn't mean that one carrying out the present invention should make use of all the features of one embodiment at the same time, or should only carry out different embodiments separately. In other words, if an implementation derived from one or more of the embodiments is applicable, a person of ordinary skill in the art can selectively make use of some or all of the features in one embodiment or selectively make use of the combination of some or all features in several embodiments to have the implementation come true, so as to increase the flexibility of carrying out the present invention.

To sum up. The delay difference detection and adjustment device and method are capable of detecting and adjusting a delay difference between two delay circuits for phase difference measurement or other utilization. Since the present invention can diminish the unit delay difference which could be treated as a measuring unit for increasing measurement accuracy/precision, it allows users to measure the deviation of a clock in a more accurate way and thus benefits a following calibration procedure or other procedures.

The aforementioned descriptions represent merely the preferred embodiments of the present invention, without any intention to limit the scope of the present invention thereto. Various equivalent changes, alterations, or modifications based on the claims of present invention are all consequently viewed as being embraced by the scope of the present invention.

What is claimed is:

1. A delay difference detection and adjustment device capable of detecting and adjusting a delay difference between two delay circuits, comprising:
   a first delay circuit including a plurality of serially connected first delay units operable to receive and then transmit a first clock;
   a second delay circuit including a plurality of serially connected second delay units operable to receive and then transmit a second clock in which the delay amount of the second delay circuit is adjustable;
   a storage circuit including a plurality of storage units coupled to the first and second delay circuits in which each of the storage units includes a data input end operable to receive the first clock from the first delay circuit and an operation clock reception end operable to receive the second clock from the second delay circuit, so that the storage circuit is operable to save a plurality of levels of the first clock in light of the second clock;
   a delay control circuit coupled to the second delay circuit and operable to adjust the delay amount of the second delay circuit; and
   an analyzing circuit coupled to at least one output end of the storage circuit and operable to generate an analysis result according to the cycle of the first clock and the plurality of levels of the first clock in which the analysis result indicates or is used to derive a unit delay difference between the first delay unit and the second delay unit.

2. The delay difference detection and adjustment device of claim 1, wherein the storage units are flip-flops.

3. The delay difference detection and adjustment device of claim 1, wherein the delay control circuit is operable to progressively adjust the delay amount of the second delay circuit, and the plurality of levels of the first clock reflects at least two positive edges or negative edges of the first clock.

4. The delay difference detection and adjustment device of claim 1, wherein the delay control circuit is operable to adjust the delay amount of the second delay circuit from an initial delay amount to a current delay amount which is more than the initial delay amount.

5. The delay difference detection and adjustment device of claim 1, wherein the plurality of levels of the first clock reflects at least two positive edges or negative edges of the first clock, and the analyzing circuit is operable to calculate the unit delay difference according to the cycle of the first clock and a number of the first delay units in connection with the interval between the at least two positive edges or negative edges of the first clock.

6. The delay difference detection and adjustment device of claim 1, wherein the plurality of levels of the first clock reflects at least two edges of the first clock, and the analyzing circuit is operable to calculate the unit delay difference according to the cycle of the first clock, the duty cycle of the first clock and a number of the first delay units in connection with the interval between the at least two edges of the first clock.

7. A delay difference detection and adjustment method carried out by a delay difference detection and adjustment device and capable of detecting and adjusting a delay difference between two delay circuits, comprising the following steps:
   receiving and then transmitting a first clock through a plurality of first delay units connected in series;
   receiving and then transmitting a second clock through a plurality of second delay units connected in series;
   storing a plurality of levels of the first clock in light of the second clock through a plurality of storage units;
   generating an analysis result according to the cycle of the first clock and the plurality of levels of the first clock in which the analysis result indicates or is used to derive a unit delay difference between the first delay unit and the second delay unit;
   adjusting a delay amount caused by the plurality of second delay units; and
   after adjusting the delay amount, generating the analysis result again.

8. The delay difference detection and adjustment method of claim 7, wherein the step of adjusting the delay amount includes: adjusting the delay amount of the second delay circuit from an initial delay amount to a current delay amount which is more than the initial delay amount.

9. The delay difference detection and adjustment method of claim 7, wherein the plurality of levels of the first clock reflects at least two positive edges or negative edges of the first clock, and the step of generating the analysis result includes: calculating the unit delay difference according to the cycle of the first clock and a number of the first delay units in connection with the interval between the at least two positive edges or negative edges of the first clock.

10. The delay difference detection and adjustment method of claim 7, wherein the plurality of levels of the first clock reflects at least two edges of the first clock, and the step of generating the analysis result includes: calculating the unit delay difference according to the cycle of the first clock, the duty cycle of the first clock and a number of the first delay units in connection with the interval between the at least two edges of the first clock.

* * * * *